United States Patent
Mitsui

(10) Patent No.: US 9,740,251 B2
(45) Date of Patent: Aug. 22, 2017

(54) COOLING DEVICE AND DEVICE

(71) Applicant: NEC Corporation, Minato-ku, Tokyo (JP)

(72) Inventor: Tomoyuki Mitsui, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/073,868

(22) Filed: Mar. 18, 2016

(65) Prior Publication Data

US 2016/0286638 A1 Sep. 29, 2016

(30) Foreign Application Priority Data

Mar. 26, 2015 (JP) .................. 2015-064070

(51) Int. Cl.
*H01L 23/40* (2006.01)
*H05K 1/02* (2006.01)
(Continued)

(52) U.S. Cl.
CPC ............ *G06F 1/20* (2013.01); *H01L 23/4006* (2013.01); *H01L 23/427* (2013.01); *H05K 1/0209* (2013.01); *H05K 2201/066* (2013.01)

(58) Field of Classification Search
CPC ............... H01L 23/4006; H01L 23/427; H01L 23/4093; H01L 24/73; H01L 23/13; H01L 23/367; H01L 23/10; H01L 23/32; H01L 23/3107; H01L 23/3672; H01L 2023/4081; H01L 2023/4056; H01L 23/40; G06F 1/20; G06F 1/183; H05K 1/0203;
(Continued)

(56) References Cited

U.S. PATENT DOCUMENTS 5,910,884 A * 6/1999 Garza .................. G06F 1/20
165/80.3
6,023,413 A * 2/2000 Umezawa ............ H01L 23/467
165/80.3
(Continued)

FOREIGN PATENT DOCUMENTS

JP H07-112029 B2 11/1995
JP 10-070383 A 3/1998
(Continued)

OTHER PUBLICATIONS

Japanese Office Action for JP Application No. 2015-064070 mailed on May 31, 2016 with English Translation.

*Primary Examiner* — Adam B Dravininkas

(57) ABSTRACT

First and the second heat dissipation sections 120a and 120b are thermally coupled with a memory 220 and a CPU 230 mounted on a surface of a substrate 210, respectively. A frame 130 is arranged above the surface of the substrate. First and second openings 131a and 131b are formed at the positions corresponding to the positions at which the first and second heat dissipation sections 120a are provided in the frame 130. First and second elastic rubbers 150a and 150b (first and second connecting sections) are provided at periphery of the first and second openings. The first and second elastic rubbers connect the first and second heat dissipation sections and the frame, respectively. With this configuration, each of a plurality of heat-generating components is thermally coupled with each of a plurality of heat dissipation sections stably, even when the plurality of heat-generating components have different heights.

5 Claims, 9 Drawing Sheets

(51) Int. Cl.
*G06F 1/20* (2006.01)
*H01L 23/427* (2006.01)

(58) Field of Classification Search
CPC ............ H05K 7/2039; H05K 7/20445; H05K 7/1069; H05K 7/1007; H05K 7/20154; H05K 7/20963; H05K 1/189
See application file for complete search history.

(56) References Cited

U.S. PATENT DOCUMENTS

| | | | |
|---|---|---|---|
| 7,450,400 B2 * | 11/2008 | Boudreaux | ......... H01L 23/3672 257/E23.084 |
| 2006/0176672 A1 | 8/2006 | Kamemoto et al. | |
| 2008/0273310 A1 * | 11/2008 | Lin | ..................... H01L 23/4006 361/719 |
| 2010/0165627 A1 * | 7/2010 | Wung | .................... F21S 2/005 362/249.02 |
| 2011/0287638 A1 * | 11/2011 | Beaman | ............... H01L 23/4006 439/65 |
| 2011/0304979 A1 * | 12/2011 | Peterson | .................... G06F 1/20 361/679.47 |
| 2012/0140417 A1 * | 6/2012 | Aspas Puertolas | .. H05K 7/2049 361/709 |
| 2014/0092547 A1 * | 4/2014 | Boyd | ..................... H05K 3/301 361/679.32 |
| 2016/0205784 A1 * | 7/2016 | Kyle | ..................... H05K 3/301 361/679.02 |

FOREIGN PATENT DOCUMENTS

| | | |
|---|---|---|
| JP | H11-121666 A | 4/1999 |
| JP | 2002-033422 A | 1/2002 |
| JP | 2006-222146 A | 8/2006 |
| WO | 2014/148026 A1 | 9/2014 |

* cited by examiner

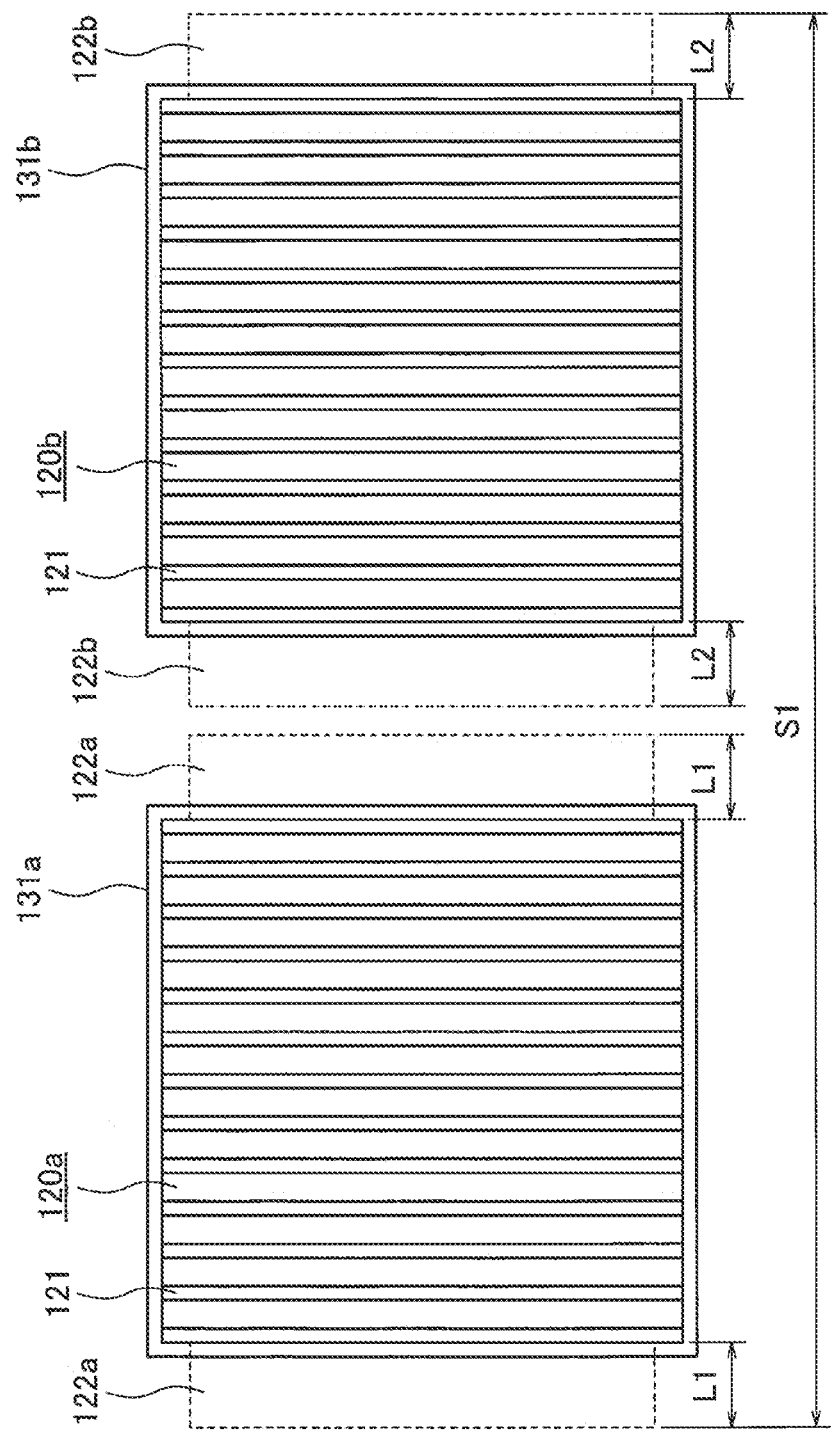

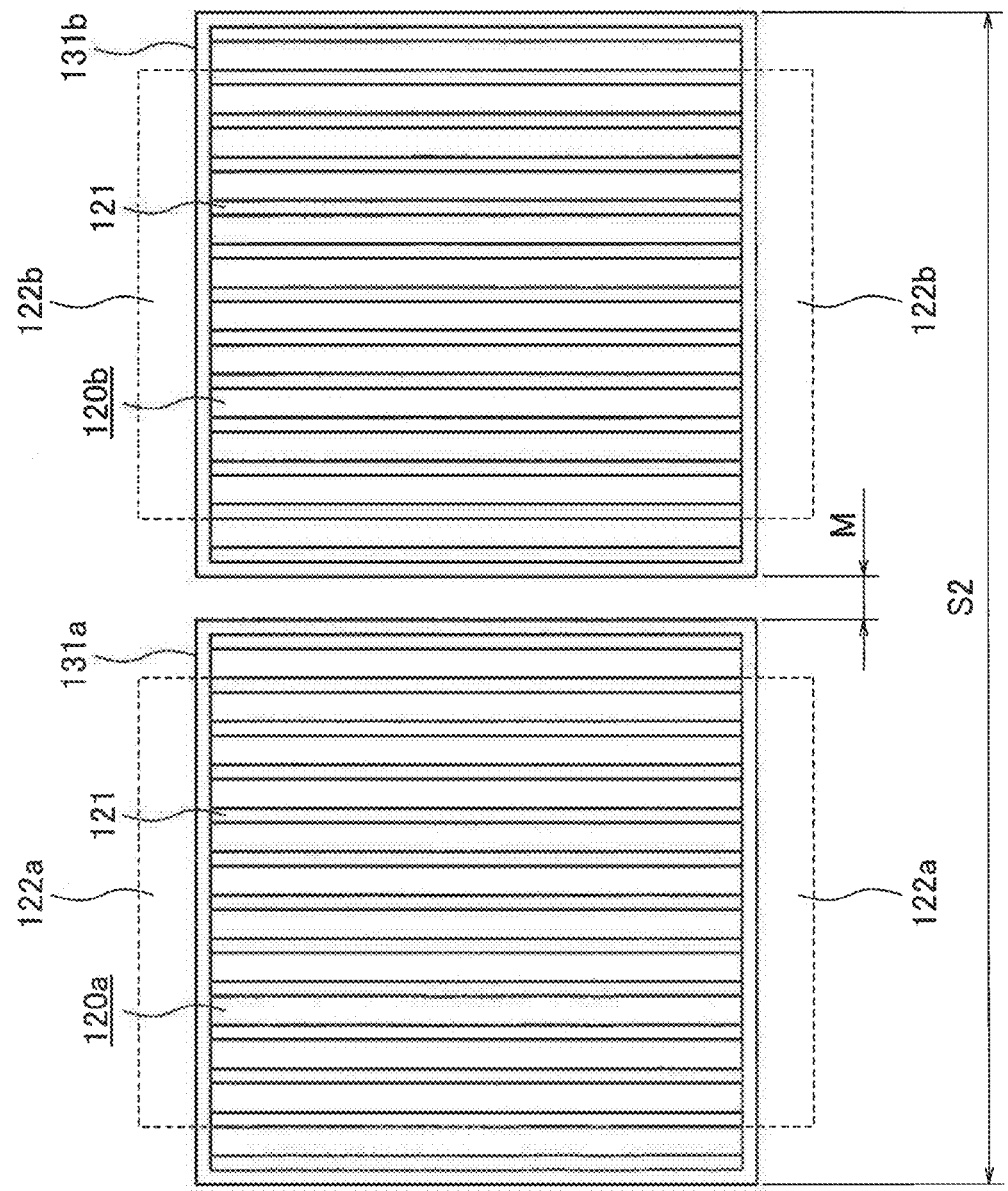

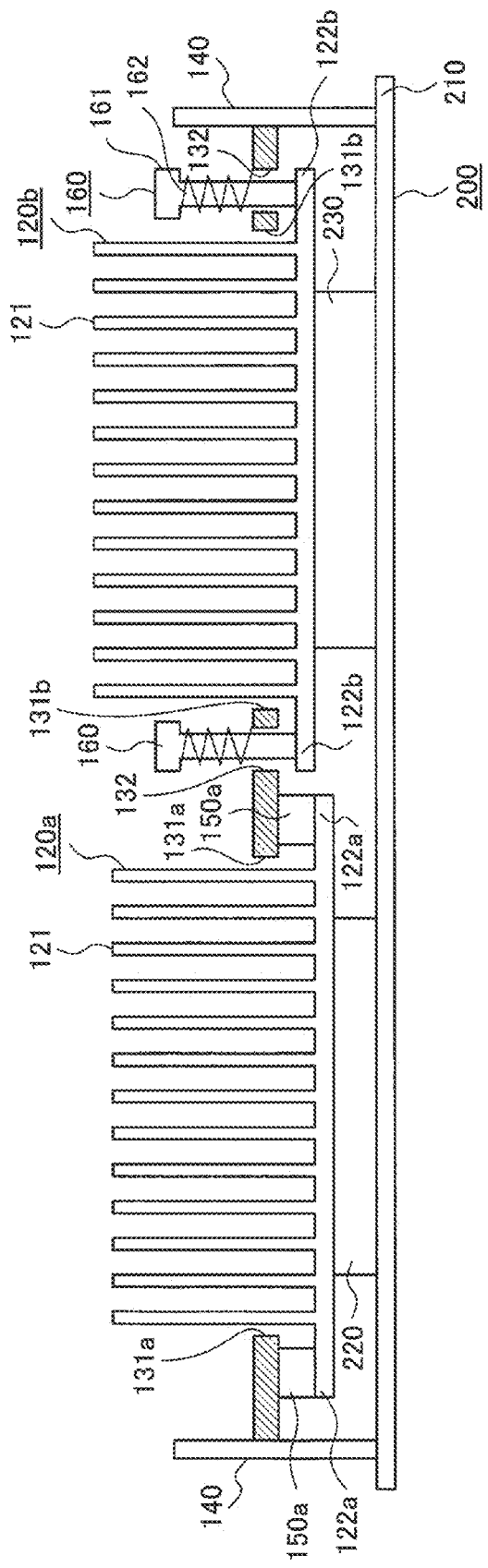

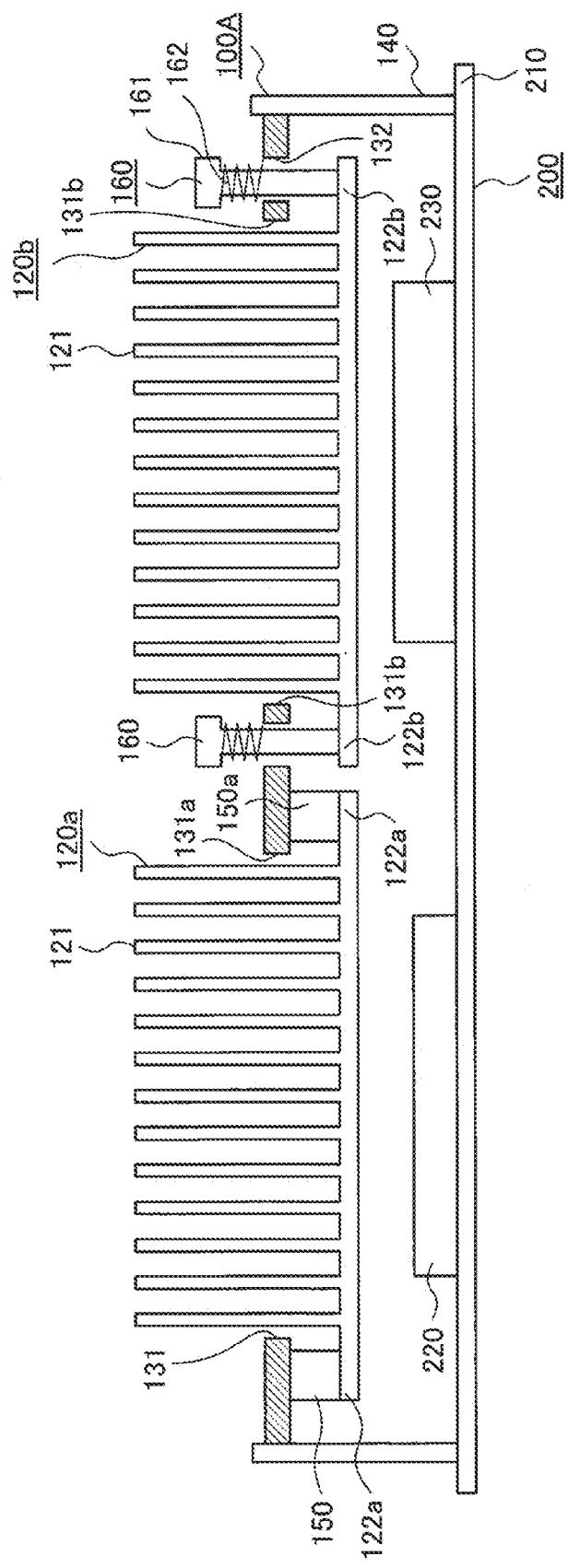

COOLING DEVICE AND DEVICE

This application is based upon and claims the benefit of priority from Japanese Patent Application No. 2015-064070, filed on Mar. 26, 2015, the disclosure of which is incorporated herein in its entirety by reference.

TECHNICAL FIELD

The present invention relates to a cooling device and the like, and for example, to a device which cools a heat-generating component mounted on a substrate.

BACKGROUND ART

PTL 1 discloses a device which can collectively cool electronic components P on a multi-chip module MCM as an invention of a cooling device for a multi-chip module.

In the invention described in PTL 1 (Japanese Laid-open Patent Publication No. H11-121666), a plurality of electronic components P including a heat-generating component are mounted on a substrate B. A heat dissipater 1 covers the plurality of electronic components P. In addition, a predetermined clearance is set between the upper parts of the plurality of electronic components P and the heat dissipater 1. A silicon sheet S is placed in the predetermined clearance, and thermally couples the plurality of electronic components P and the heat dissipater 1.

Note that techniques relevant to the present invention are also disclosed in PTL 2 (Japanese Examined Patent Publication No. H7-112029), and PTL 3 (Japanese Laid-open Patent Publication No. 2002-33422).

However, in the technique described in PTL 1, when the plurality of electronic components P have different heights, there is a problem of a case that a part of the plurality of electronic components P may not be thermally coupled with the heat dissipater 1 if the predetermined clearance between the upper parts of the plurality of electronic components P and the heat dissipater 1, and a sheet thickness of the silicone sheet S are not set at proper sizes, respectively.

The present invention is made in view of such circumstances, and an exemplary object of the present invention is to provide a cooling device and the like which can thermally couple each of a plurality of heat-generating components with each of a plurality of heat dissipation sections stably, even when the plurality of heat-generating components have different heights.

SUMMARY

An exemplary object of the present invention is to provide a cooling device and the like which can thermally couple each of a plurality of heat-generating components with each of a plurality of heat dissipation sections stably, even when the plurality of heat-generating components have different heights.

A cooling device includes first and second heat dissipation sections that are thermally coupled with first and second heat-generating components, respectively, the first and second heat-generating components mounted on a first surface of a substrate; a frame arranged above the first surface of the substrate; first and second openings formed in the frame, positions of the first and second openings corresponding to positions at which the first and second heat dissipation sections are provided, respectively; and first and second flexible connecting sections provided at peripheries of the first and second openings, respectively, the first and second connecting sections respectively connecting the first and second heat dissipation sections and the frame.

A device includes first and second heat-generating components mounted on a first surface of a substrate; first and second heat dissipation sections that are thermally coupled with the first and second heat-generating components, respectively; a frame arranged above the first surface of the substrate; first and second openings formed in the frame, positions of the first and second openings corresponding to positions at which the first and second heat dissipation sections are provided, respectively; and first and second flexible connecting sections provided at peripheries of the first and second openings respectively connecting the first and second heat dissipation sections and the frame.

BRIEF DESCRIPTION OF THE DRAWINGS

Exemplary features and advantages of the present invention will become apparent from the following detailed description when taken with the accompanying drawings in which:

FIG. 6 is a partial top view showing the state after attaching the cooling device according to the first exemplary embodiment of the present invention to the electronic substrate;

FIG. 7 is a partial top views showing a state after attaching a cooling device according to a modification of the first exemplary embodiment of the present invention to an electronic substrate;

FIG. 8 is a cross-sectional view showing a state after attaching a cooling device according to a second exemplary embodiment of the present invention to an electronic substrate; and FIG. 9 is a cross-sectional view showing a state before attaching the cooling device according to the second exemplary embodiment of the present invention to the electronic substrate.

EXEMPLARY EMBODIMENT

Exemplary embodiments of the present invention will now be described in detail in accordance with the accompanying drawings.

First Exemplary Embodiment

A configuration of a cooling device 100 in a first exemplary embodiment of the present invention will be described.

Figure 1:
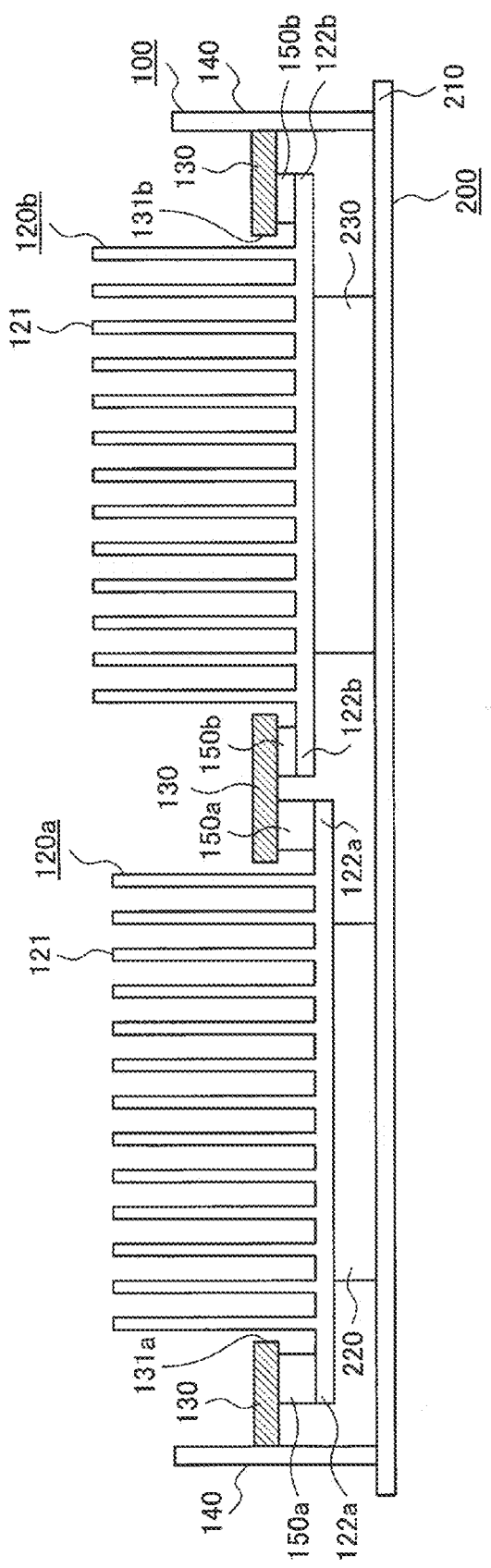
FIG. 1 is a cross-sectional view showing a state after attaching a cooling device according to a first exemplary embodiment of the present invention to an electronic substrate.
Figure 2:
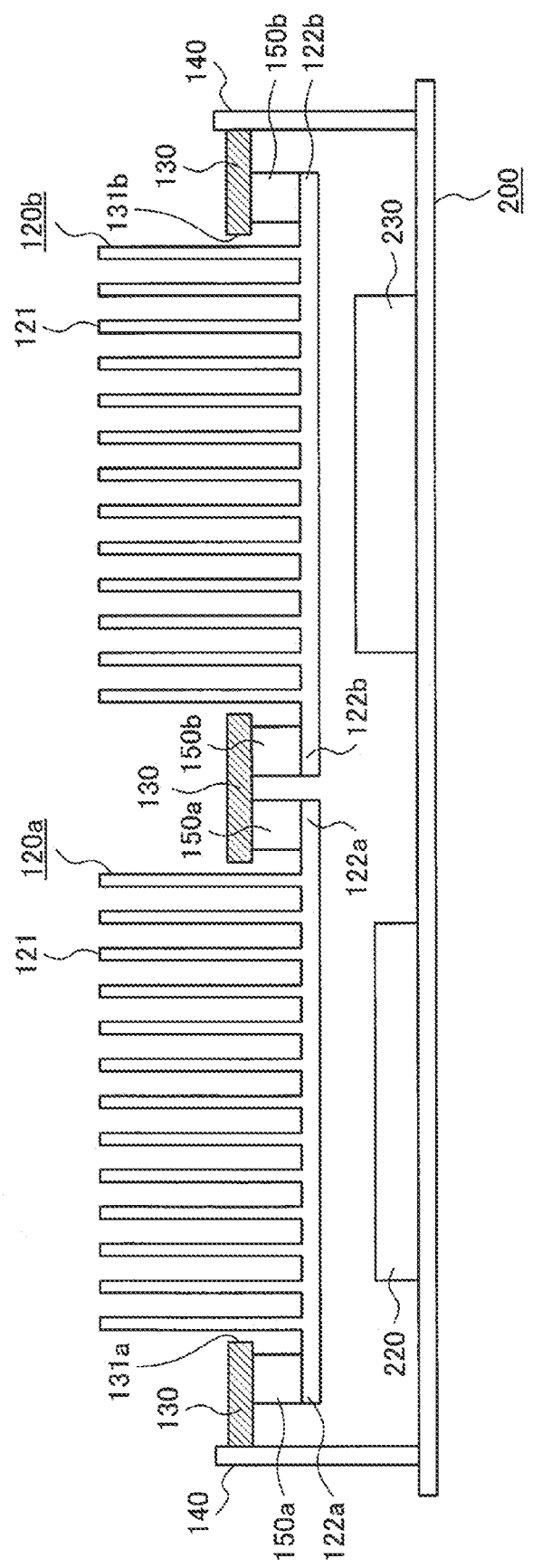
FIG. 2 is a cross-sectional view showing a state before attaching the cooling device according to the first exemplary embodiment of the present invention to the electronic substrate.
Figure 3:
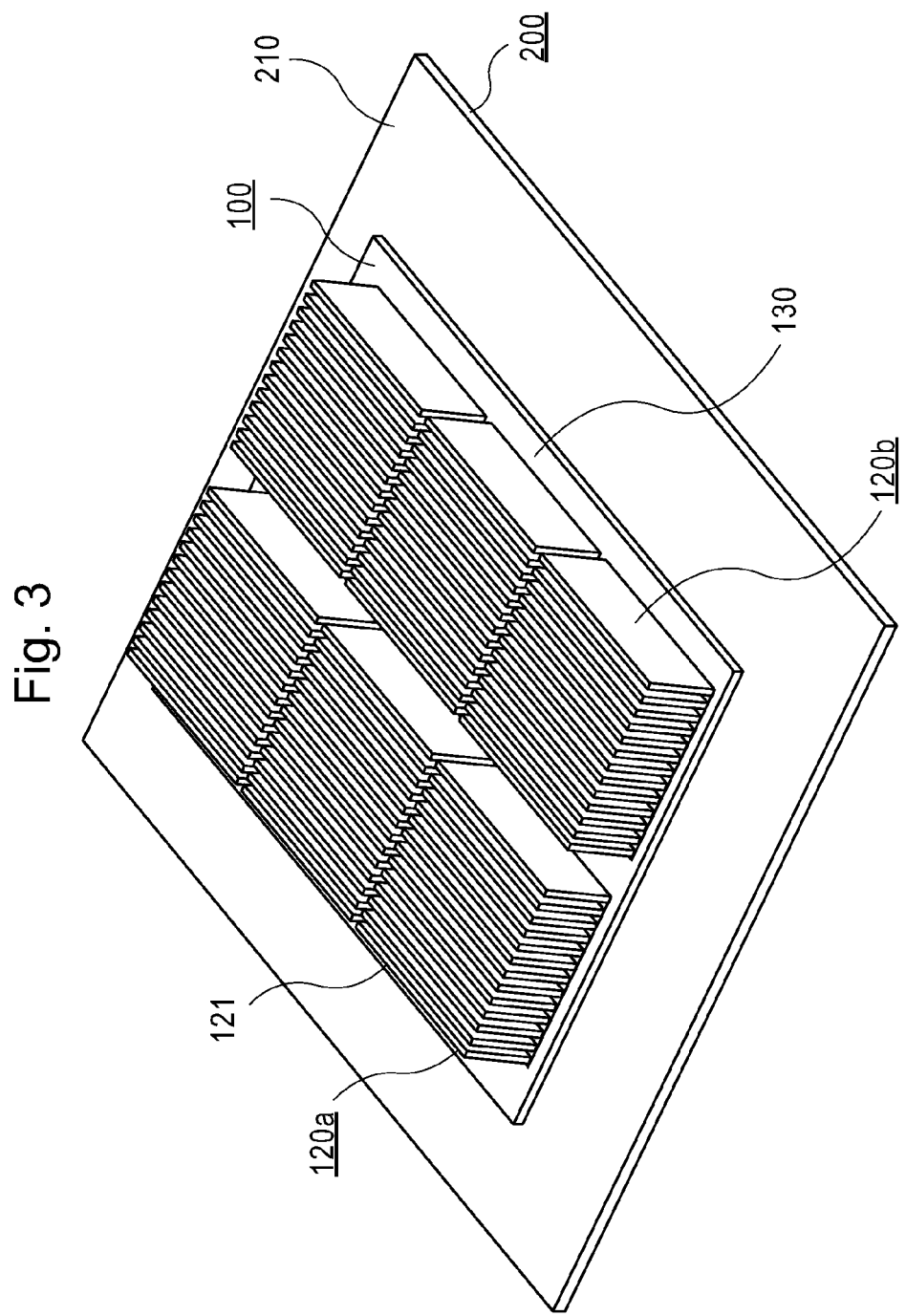
FIG. 3 is a perspective view showing the state after attaching the cooling device according to the first exemplary embodiment of the present invention to the electronic substrate.
Figure 4:
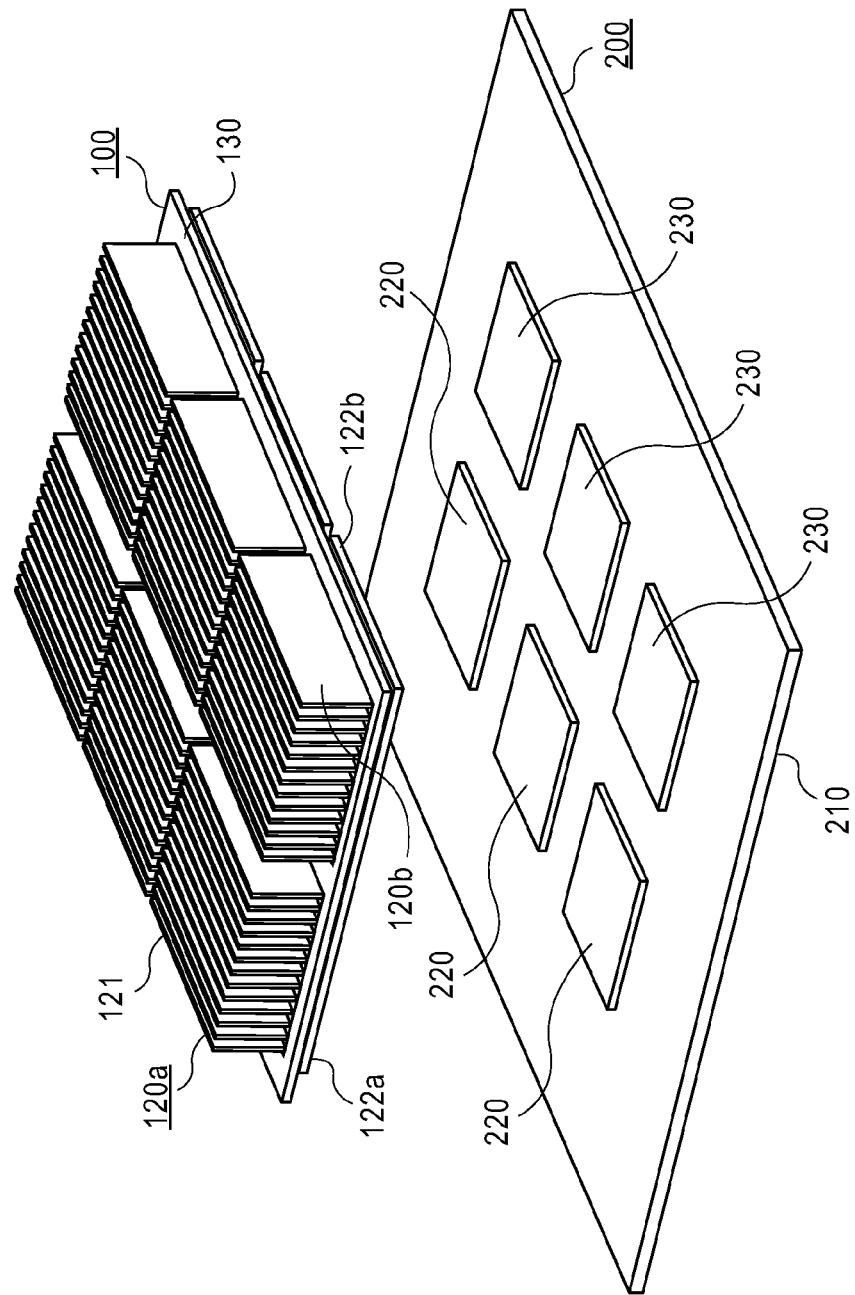
FIG. 4 is a perspective view showing the state before attaching the cooling device according to the first exemplary embodiment of the present invention to the electronic substrate.
Figure 5:
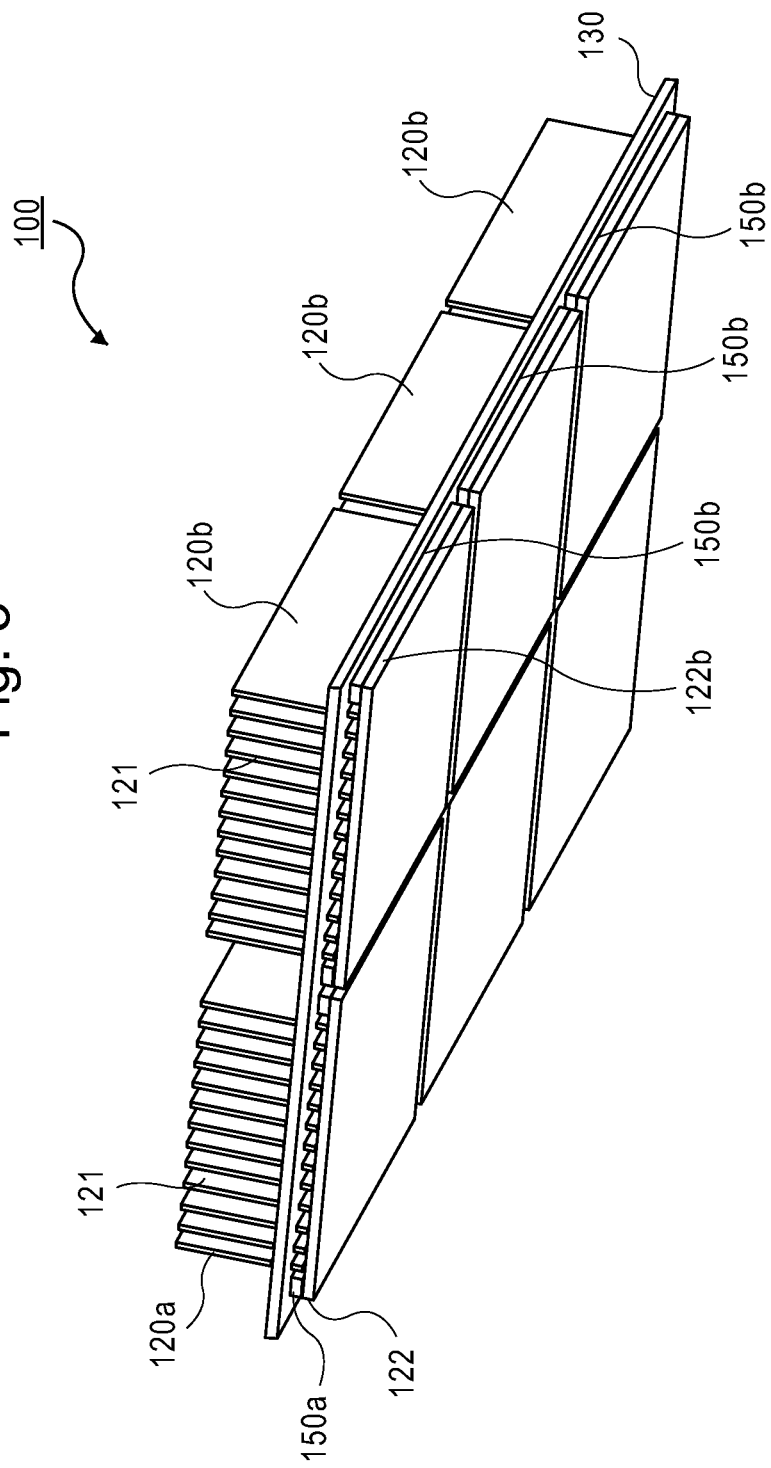
FIG. 5 is a perspective view showing a back surface side of the cooling device according to the first exemplary embodiment of the present invention.

FIG. 1 is a cross-sectional view showing a state after attaching the cooling device 100 to an electronic substrate 200. FIG. 2 is a cross-sectional view showing a state before attaching the cooling device 100 to the electronic substrate 200. FIG. 3 is a perspective view showing the state after attaching the cooling device 100 to the electronic substrate 200. FIG. 4 is a perspective view showing the state before attaching the cooling device 100 to the electronic substrate 200. FIG. 5 is a perspective view showing a back surface side of the cooling device 100.

For convenience of explanation, a configuration of the electronic substrate 200 will be described first. As shown in FIG. 1, FIG. 2, and FIG. 4, the electronic substrate 200 includes a substrate 210, a memory or memories 220, and a CPU (Central Processing Unit) or CPUs 230.

The substrate 210 has a plate shape. A glass epoxy resin is used for the material of the substrate 210, for example. A frame holding member 140 mentioned below is attached to the substrate 210.

The memory 220 and the CPU 230 are mounted adjacent to each other on a surface (upper side of drawings in FIG. 1 and FIG. 2) of the substrate 210. Note that the surface of the substrate 210 is a first surface in the present invention. The memory 220 and the CPU 230 correspond to a first or second heat-generating component of the present invention. The heat-generating component is an electronic component which generates heat when operating. Note that it is described that the memory 220 and the CPU 230 are mounted on the substrate 210. On the other hand, only a plurality of the memories 220 may be mounted on the substrate 210. Similarly, only a plurality of the CPUs 230 may be mounted on the substrate 210. The memory 220 and the CPU 230 are thermally coupled with first and second heat dissipation sections 120a and 120b mentioned below, respectively.

In the above, the configuration of the electronic substrate 200 is described.

Next, a configuration of the cooling device 100 will be described.

As shown in FIG. 1 and FIG. 2, the cooling device 100 includes the first and second heat dissipation sections 120a and 120b, a frame 130, the frame holding member 140, and first and second elastic rubbers 150a and 150b.

As shown in FIG. 1, FIG. 2, and FIG. 4, the first heat dissipation section 120a is provided so as to face the memory 220 mounted on the surface of the substrate 210. Similarly, the second heat dissipation section 120b is provided so as to face the CPU 230 mounted on the surface of the substrate 210. In addition, the first heat dissipation section 120a is thermally coupled with the memory 220. Similarly, the second heat dissipation section 120b is thermally coupled with the CPU 230.

Note that, in the example of FIG. 1, the first heat dissipation section 120a and the memory 220 are thermally coupled directly with no intervening medium. On the other hand, the first heat dissipation section 120a and the memory 220 may be thermally coupled, for example, through a heat conduction sheet (not shown) or heat dissipation grease (not shown). Similarly, in the example of FIG. 1, the second heat dissipation section 120b and the CPU 230 are thermally coupled directly with no intervening medium. On the other hand, the second heat dissipation section 120b and the CPU 230 may be thermally coupled, for example, through a heat conduction sheet (not shown) or heat dissipation grease (not shown).

Note that, a carbon fiber, silicon, or the like is used for the material of the heat conduction sheet, for example. The heat dissipation grease means grease in which particles with high heat conductivity are mixed. As a material for the base of the grease, modified silicon, or the like is used, of which viscosity does not change in a range from a normal temperature to a high temperature in some degree, for example. As a material for the particles with high heat conductivity, alumina, magnesium oxide, aluminum nitride, or the like other than copper, silver, aluminum, or the like is used, for example.

As shown in FIG. 1, FIG. 2, and FIG. 4, the first heat dissipation section 120a includes a plurality of fins 121 and first flange sections 122a. Similarly, the second heat dissipation section 120b includes a plurality of fins 121 and second flange sections 122b. The first heat dissipation section 120a is attached in a first opening 131a of the frame 130 mentioned below. Similarly, the second heat dissipation section 120b is attached in a second opening 131b of the frame 130 mentioned below.

The first heat dissipation section 120a is movable toward the memory 220 in the first opening 131a. Similarly, the second heat dissipation section 120b is movable toward the CPU 230 in the second opening 131b.

As a material for the first and the second heat dissipation sections 120a and 120b, a material with high heat conductivity such as iron and aluminum is used. The first and second heat dissipation sections 120a and 120b are also called as a heat sink.

As shown in FIG. 1 to FIG. 5, the plurality of fins 121 are provided in the first and the second heat dissipation sections 120a and 120b so as to extend in a direction away from the surface of the substrate 210 in a plate shape.

The first flange sections 122a are provided on the first heat dissipation section 120a so as to face an outer peripheral rim of the first opening 131a of the frame 130 mentioned below. Accordingly, the first heat dissipation section 120a can be provided so as not to fall out from the first opening 131a of the frame 130 in the direction away from the substrate 210. Similarly, the second flange sections 122b are provided on the second heat dissipation section 120b so as to face an outer peripheral rim of the second opening 131b of the frame 130 mentioned below. Accordingly, the second heat dissipation section 120b can be provided so as not to fall out from the second opening 131b of the frame 130 in the direction away from the substrate 210.

The first and second flange sections 122a and 122b are formed at a lower end outer peripheral section of the first and second heat dissipation sections 120a and 120b so as to protrude therefrom, respectively.

FIG. 6 is a partial top view showing a state after attaching the cooling device 100 to the electronic substrate 200. FIG. 6 shows an example in which the first heat dissipation section 120a and the second heat dissipation section 120b are arranged in parallel for convenience. In addition, the first and second elastic rubbers 150a and 150b are omitted for convenience.

As shown in FIG. 6, when the first opening 131a of the frame 130 is rectangular, the first flange section 122a are provided along opposite sides which face at least each other among the first opening 131a. Accordingly when the first opening 131a of the frame 130 is rectangular, the first flange section 122a are formed so as to trace at least a pair of opposing sides of the first opening 131a. Similarly, when the second opening 131b is rectangular, the second flange sections 122b are provided along opposite sides which face at least each other among the second opening 131b. Accordingly when the second opening 131b is rectangular, the second flange sections 122b are formed so as to trace at least a pair of opposing sides of the second opening 131b.

Here, as shown in FIG. 6, the first and second flange sections 122a and 122b are arranged so as to face each other between the first and second openings 131a and 131b. In this case, a distance S1 between the left end section of the first flange sections 122a and the right end section of the second flange sections 122b is equal to or greater than twice of a total value of lengths L1 and L2 of the first and second flange sections 122a and 122b, in comparison with the total value of the widths B1 and B2 of the first and second openings 131a and 131b. In other words, S1>(B1+B2)+2×(L1+L2) is established.

Next, a modification, in which the arrangement relationship of the first and second flange sections 122a and 122b and the first and second openings 131a and 131b is changed, will be described.

FIG. 7 is a partial top view showing a state after attaching a modification of a cooling device 100 to the electronic substrate 200, as in FIG. 6. Also in FIG. 7, an example is shown in which the first heat dissipation section 120a and the second heat dissipation section 120b are arranged in parallel, as in FIG. 6. The first and second elastic rubbers 150a and 150b are omitted for convenience.

Here, FIG. 6 and FIG. 7 are contrasted. In FIG. 6 and FIG. 7, when the first opening 131a of the frame 130 is rectangular, the first flange sections 122a are provided along opposite sides which face at least each other among the first openings 131a. Accordingly when the first opening 131a of the frame 130 is rectangular, the first flange sections 122a are formed so as to trace at least a pair of opposing sides of the first opening 131a. Similarly, when the second opening 131b of the frame 130 is rectangular, the second flange sections 122b are provided along opposite sides which face at least each other among the second openings 131b. Accordingly when the second opening 131b is rectangular, the second flange sections 122b are formed so as to trace at least a pair of opposing sides of the second opening 131b. FIG. 6 and FIG. 7 are the same on these points. On the other hand, in FIG. 6, the first and second flange sections 122a and 122b are arranged so as to face each other between the first and second openings 131a and 131b. On the one hand, in FIG. 7, the first and second flange sections 122a and 122b are not arranged between the first and second openings 131a and 131b. FIG. 6 and FIG. 7 are different from each other on this point.

In the example shown in FIG. 7, a distance S2 between the left end section of the first flange sections 122a and the right end section of the second flange sections 122b is a total value of a sum of widths B1 and B2 of the first and second openings and a distance M between the first and second openings 131a and 131b. In other words, S2=(B1+B2)+M is established.

Here, M in FIG. 7 can be made small limitlessly, as long as the rigidity of the frame 130 is secured. On the other hand, with respect to a value of 2×(L1+L2) in FIG. 7, it is not possible to make the lengths L1 and L2 of the first and second flange sections 122a and 122b zero.

For this reason, S2 in FIG. 7 can be set to be smaller than S1 in FIG. 6. Therefore, a contour width of the cooling device in the example shown in FIG. 7 can be made smaller than a contour width of the cooling device in the example shown in FIG. 6. As a result, the cooling device can be downsized.

Note that, FIG. 6 and FIG. 7 shows the examples in which the first and second flange sections 122a and 122b are formed so as to trace at least a pair of opposing sides of the first and second openings 131a and 131b. On the other hand, the first flange sections 122a may be formed so as to protrude along a whole periphery of the lower end outer peripheral section of the first heat dissipation section 120a. The second flange sections 122b may be formed so as to protrude along a whole periphery of the lower end outer peripheral section of the second heat dissipation section 120b.

Return to FIG. 1 to FIG. 5, the frame 130 has a plate shape. The frame 130 is attached to the surface (surface on upper side of drawings in FIG. 1 and FIG. 2) side of the substrate 210 through the frame holding member 140. Hereby, the frame 130 is arranged at the surface side of the substrate 210 through the frame holding member 140.

As shown in FIG. 1 and FIG. 2, the frame 130 includes the first and second openings 131a and 131b. The first opening 131a is formed at the position corresponding to the position at which the first heat dissipation section 120a is provided in the frame 130. The first heat dissipation section 120a passes through the first opening 131a. In other words, the first heat dissipation section 120a is movable toward the memory 220 in the first opening 131a. Similarly, the second opening 131b is formed at the position corresponding to the position at which the second heat dissipation section 120b is provided in the frame 130. The second heat dissipation section 120b passes through the second opening 131b. In other words, the second heat dissipation section 120b is movable toward the CPU 230 in the second opening 131b.

As shown in FIG. 1 and FIG. 2, the frame holding member 140 holds the frame 130 on the substrate 210. The frame holding member 140 is provided in the outer peripheral section of the substrate 210. Note that, in FIG. 3 to FIG. 5, the frame holding member 140 is omitted for convenience.

As shown in FIG. 1, FIG. 2, and FIG. 5, the first elastic rubbers 150a are provided between surfaces, which face the first opening 131a among the first flange sections 122a, and the outer peripheral rim of the first opening 131a. Similarly, the second elastic rubbers 150b are provided between surfaces, which face the second opening 131b among the second flange sections 122b, and the outer peripheral rim of the second opening 131b.

The first and second elastic rubbers 150a and 150b have flexibility (may also include elasticity). Note that the name of the elastic rubbers 150a and 150b includes "elasticity", but the elasticity is not an essential requirement as long as the elastic rubbers 150a and 150b have at least flexibility. The first elastic rubbers 150a connect the first heat dissipation section 120a and the frame 130. The first elastic rubbers 150a press the first heat dissipation section 120a toward the memory 220. The second elastic rubbers 150b connect the second heat dissipation section 120b and the frame 130. The second elastic rubbers 150b press the second heat dissipation section 120b toward the CPU 230. The first and second elastic rubbers 150a and 150b correspond to the first and second connecting sections of the present invention. In addition, the first and second elastic rubbers 150a and 150b correspond to rubber members of the present invention.

The first and second elastic rubbers 150a and 150b are provided, for example, corresponding to the shapes of the first and second flange sections 122a and 122b. In other words, when the first opening 131a is rectangular and the first flange sections 122a are provided along opposite sides which face at least each other among the first openings 131a, the first elastic rubbers 150a are attached to the first flange sections 122a at two different places that face each other. Similarly, when the second opening 131b is rectangular and the second flange sections 122b are provided along opposite sides which face at least each other among the second openings 131b, the second elastic rubbers 150b are attached to the second flange sections 122b at two different places that face each other.

When the first and second flange sections 122a and 122b are formed in a ring shape along a whole periphery of the lower end outer peripheral section of the first and second heat dissipation sections 120a and 120b so as to protrude therefrom, the first and second elastic rubbers 150a and 150b are attached to the first and second flange sections 122a and 122b of a ring shape.

When the first flange sections 122a are formed at three different places of the lower end outer peripheral section of the first heat dissipation section 120a so as to protrude therefrom, the first elastic rubbers 150a are attached to the first flange sections 122a at three different places. Similarly, when the second flange sections 122b are formed at three different places of the lower end outer peripheral section of the second heat dissipation section 120b so as to protrude therefrom, the second elastic rubbers 150b are attached to the second flange sections 122b at three different places.

In the above, the configuration of the cooling device 100 is described.

Next, a method for attaching the cooling device 100 to the electronic substrate 200 will be described.

First, the electronic substrate 200, the first and second heat dissipation sections 120a and 120b, the frame 130, and the frame holding member 140 are prepared.

Next, as shown in FIG. 2, the first and second heat dissipation sections 120a and 120b are attached from the back surface (surface on lower side of the drawing) side of the frame 130 in the opening 131 of the frame 130. On this occasion, the first elastic rubbers 150a are caused to intervene between the surface which faces the first opening 131a among the first flange sections 122a, and the outer peripheral rim of the first opening 131a. Similarly, the second elastic rubbers 150b are caused to intervene between the surface which faces the second opening 131b among the second flange sections 122b, and the outer peripheral rim of the second opening 131b.

The first heat dissipation section 120a, the second heat dissipation section 120b, the frame 130, the first elastic rubbers 150a, and the second elastic rubbers 150b which are assembled are held on the substrate 210 through the frame holding member 140. At this time, the memory 220 and the first heat dissipation section 120a are arranged so as to face each other. Simultaneously, the CPU 230 and the second heat dissipation section 120b are arranged so as to face each other.

Next, as shown in FIG. 1, the frame 130 is approached to the substrate 210 so as to cause the first and second elastic rubbers 150a and 150b to be compressed. Hereby, the first elastic rubbers 150a press the first heat dissipation section 120a toward the memory 220, respectively. Simultaneously, the second elastic rubbers 150b press the second heat dissipation section 120b toward the CPU 230, respectively. As a result, the first heat dissipation section 120a and the memory 220 are thermally coupled with each other. Similarly, the second heat dissipation section 120b and the CPU 230 are thermally coupled with each other.

Note that when a heat conduction sheet or heat dissipation grease are provided between the first heat dissipation section 120a and the memory 220, or between the second heat dissipation section 120b and the CPU 230, the first and second elastic rubbers 150a and 150b press the heat dissipation sections 120a and 120b toward the memory 220 and the CPU 230, respectively, so that the heat conduction sheet and heat dissipation grease can be crushed to the maximum. Hereby, the first heat dissipation section 120a and the memory 220 are thermally coupled more securely. Similarly, the second heat dissipation section 120b and the CPU 230 are thermally coupled more securely. In particular, when the gap (clearance) between the first heat dissipation section 120a and the memory 220 or the gap between the second heat dissipation section 120b and the CPU 230 is large, the thermal resistance of the heat dissipation grease deteriorates, which tends to cause a temperature of the memory 220 and the CPU 230 to rise. However, as described above, the cooling device 100 can crush the heat dissipation grease to the maximum by pressing the first and the second heat dissipation sections 120a and 120b toward the memory 220 and the CPU 230 by the first and second elastic rubbers 150a and 150b, respectively. Accordingly, the gap between the first heat dissipation section 120a and the memory 220 can be reduced. Similarly, the gap between the second heat dissipation section 120b and the CPU 230 can be reduced. Hereby, a deterioration of a thermal resistance of the heat dissipation grease, and the rise of a temperature of the memory 220 and the CPU 230 can be suppressed.

As above, the cooling device 100 in the first exemplary embodiment of the present invention includes the first and second heat dissipation sections 120a and 120b, the frame 130, the first and second openings 131a and 131b, and the first and second elastic rubbers 150a and 150b (first and second connecting sections). The first and second heat dissipation sections 120a and 120b are thermally coupled with the memory 220 and the CPU 230 (first and second heat-generating components) mounted on the surface (first surface) of the substrate 210, respectively. The frame 130 is arranged above the surface of the substrate 210. The first and second openings 131 are formed at the positions corresponding to the positions at which the first and second heat dissipation sections 120a and 120b are provided in the frame 130. Hereby, the first and second heat dissipation sections 120a and 120b are movable toward the memory 220 or the CPU 230 through the first and second openings 131, respectively. The first and second elastic rubbers 150a and 150b have flexibility, and are provided at periphery of the first and second openings 131a and 131b. The first and second elastic rubbers 150a and 150b connect the first and second heat dissipation sections 120a and 120b, and the frame 130.

In this way, the first and second elastic rubbers 150a and 150b have flexibility. In addition, the first and second elastic rubbers 150a and 150b connect the first and second heat dissipation sections 120a and 120b, and the frame 130. Therefore, the first and second elastic rubbers 150a and 150b press the first and second heat dissipation sections 120a and 120b toward the memory 220 and the CPU 230 by the flexibility of the first and second elastic rubbers 150a and 150b, respectively. Hereby, the first and second elastic rubbers 150a and 150b connect the first and second heat dissipation sections 120a and 120b, and the frame 130, respectively. In other words, the elastic rubbers 150a press the first heat dissipation section 120a toward the memory 220 by the flexibility of the elastic rubbers 150a regardless of the mounting height of the CPU 230. Similarly, the elastic rubbers 150b press the second heat dissipation section 120b toward the CPU 230 by the flexibility of the elastic rubbers 150b regardless of the mounting height of the memory 220. Therefore, even when a plurality of heat-generating components (memory 220 and CPU 230) have different heights, each of the plurality of heat-generating components can be stably connected with each of a plurality of heat dissipation sections (first and second heat dissipation sections 120a and 120b) by a simple configuration.

The cooling device 100 in the first exemplary embodiment of the present invention includes the first and second flange sections 122a and 122b. The first and second flange sections 122a and 122b are formed so as to face the outer peripheral rims of the first and second openings 131a and 131b, and so as to protrude from outer peripheral sections of the heat dissipation sections 120a and 120b. The first and second elastic rubbers 150a and 150b (first and second connecting sections) are provided between the surfaces of the first and second flange sections 122a and 122b, which face the first and second openings 131a and 131b, and the outer peripheral rims of the first and second openings 131a and 131b.

In this way, the first and second flange sections 122a and 122b are formed at outer peripheral sections of the first and second heat dissipation sections 120a and 120b so as to protrude therefrom, and the first and second elastic rubbers 150a and 150b are provided between the surfaces which face the first and second openings 131a and 131b among the first and second flange sections 122a and 122b, and the outer peripheral rims of the first and second openings 131a and 131b. Hereby, a connect function for connecting the first and second heat dissipation sections 120a and 120b with the frame 130 can be provided in a compact and easy manner.

In the cooling device 100 in the first exemplary embodiment of the present invention, when the first and second openings 131a and 131b are rectangular, the first and second flange sections 122a and 122b is formed so as to trace at least a pair of opposing sides of the first and second openings 131a and 131b. Hereby, connect functions for connecting the first and second heat dissipation sections 120a and 120b with the frame 130 can be arranged in a well-balanced manner. In other words, the heat dissipation sections 120a and 120b can be maintained in parallel to the surface of the substrate 210, and the heat dissipation sections 120a and 120b are suppressed from a large inclination against the surface of the substrate 210.

In the cooling device 100 in the first exemplary embodiment of the present invention, the first and second flange sections 122a and 122b are not arranged between the first and second openings 131a and 131b. Hereby, the distance between the first and second openings 131a and 131b can be minimized. As a result, the maximum width when the first and second openings 131a and 131b are arranged in parallel (for example, a distance S2 between the right end section of the first opening 131a and the left end section of the second opening 131b) can be minimized. As a result, the width of the cooling device can be reduced.

In the cooling device 100 in the first exemplary embodiment of the present invention, the first and second connecting sections (first and second elastic rubbers 150a and 150b) are rubber members. Hereby, the first and second connecting sections can be configured using simple members.

In the cooling device 100 in the first exemplary embodiment of the present invention, the first connecting section (first elastic rubbers 150a), the second connecting section (second elastic rubbers), and the frame 130 may be thermally conductive. Hereby, the heat dissipation sections 120a and 120b, and the frame 130 are thermally coupled by the first and second elastic rubbers 150a and 150b. As a result, the heat of the memory 220 conducts to the frame 130 through the first heat dissipation section 120a and the first elastic rubbers 150a. Similarly, the heat of the CPU 220 conducts to the frame 130 through the second heat dissipation section 120b and the second elastic rubbers 150b.

Therefore, even when the heat of the heat-generating components (memory 220, CPU 230) exceeds, for example, the heat dissipation capability of the first and second heat dissipation sections 120a and 120b which are thermally coupled with the heat-generating components, the heat of the heat-generating components can be dissipated.

The device in the first exemplary embodiment of the present invention includes the memory 220 and the CPU 230 (first and second heat-generating components), the first and second heat dissipation sections 120a and 120b, the frame 130, the first and second openings 131a and 131b, and the first and second elastic rubbers 150a and 150b (first and second connecting sections). The memory 220 and the CPU 230 are mounted on the surface (first surface) of the substrate 210. The first and second heat dissipation sections 120a and 120b are thermally coupled with the memory 220 and the CPU 230 (first and second heat-generating components), respectively. The frame 130 is arranged above the surface of the substrate 210. The first and second openings 131 are formed at the positions corresponding to the positions at which the first and second heat dissipation sections 120a and 120b are provided in the frame 130. The first and second elastic rubbers 150a and 150b have flexibility, and are provided at the periphery of the first and second openings 131a and 131b. The first and second elastic rubbers 150a and 150b connect the first and second heat dissipation sections 120a and 120b, and the frame 130. Even in such a configuration, the same effect as the above-described cooling device 100 can be achieved.

Second Exemplary Embodiment

Next, a configuration of a cooling device 100A in a second exemplary embodiment of the present invention will be described. FIG. 8 is a cross-sectional view showing a state after attaching the cooling device 100A to an electronic substrate 200. FIG. 9 is a cross-sectional view showing a state before attaching the cooling device 100A to the electronic substrate 200. FIG. 8 corresponds to FIG. 1, and FIG. 9 corresponds to FIG. 2. Note that in FIG. 8 and FIG. 9, a sign equivalent to the sign shown in FIG. 1 to FIG. 7 is given to each component equivalent to the component shown in FIG. 1 to FIG. 7.

As shown in FIG. 8 and FIG. 9, the cooling device 100A includes the first and second heat dissipation sections 120a and 120b, a frame 130, a frame holding member 140, and screws with spring 160.

Here, FIG. 1 and FIG. 2, and FIG. 8 and FIG. 9 are contrasted. As shown in FIG. 1 and FIG. 2, the second elastic rubbers 150b are provided between the frame 130 and the second flange sections 122b as the second connecting section. In contrast, as shown in FIG. 8 and FIG. 9, the screws with spring 160 are attached to the outer peripheral sections of the opening 131 of the frame and to the second flange sections 122b as the second connecting section. Both are different from each other on this point.

As shown in FIG. 8 and FIG. 9, the screws with spring 160 include a screw 161 and a helical spring 162. The screws with spring 160 correspond to the first and second connecting sections and spring members of the present invention.

The screw 161 is attached to the second flange sections 122b through a screw hole 132 formed in the frame 130. A resin member or a metal member such as stainless steel is used for the material of the screw 161.

The helical spring 162 is provided between a screw head of the screw 161 and the surface (surface on upper side in FIG. 6 and FIG. 7) of the frame 130. The helical spring 162 is compressed by the screw 161 which is fastened in the screw hole 132. Hereby, the helical spring 162 presses (urges) the heat dissipation section 120b toward the CPU 230. As a result, the heat dissipation section 120b and the CPU 230 are thermally coupled. Note that a resin member or a metal member such as stainless steel is used for the material of the helical spring 162.

The screw 161 and the helical spring 162 may be thermally conductive. In this case, the screw 161 and the helical spring 162 thermally connect the second heat dissipation section 120b and the frame 130.

Note that the helical spring 162 is used in the present embodiment, but a spring washer may be used instead of the helical spring 162.

As above, the configuration of the cooling device 100A is described.

Next, a method for attaching the cooling device 100A to the electronic substrate 200 will be described.

First, the electronic substrate 200, the first and second heat dissipation sections 120a and 120b, the frame 130, and the frame holding member 140 are prepared.

Next, as shown in FIG. 9, the first and second heat dissipation sections 120a and 120b are attached in the first and second openings 131a and 131b of the frame 130, respectively.

On this occasion, on the side of the first heat dissipation section 120, the first elastic rubbers 150a are caused to intervene between the surfaces which face the first opening 131a among the first flange sections 122a, and the outer peripheral rim of the first opening 131a.

The first heat dissipation section 120a, the second heat dissipation section 120b, the frame 130, the first elastic rubbers 150a which are assembled are held on the substrate 210 through the frame holding member 140.

At this time, the memory 220 and the first heat dissipation section 120a are arranged so as to face each other. The CPU 230 and the second heat dissipation section 120b are arranged so as to face each other.

Next, as shown in FIG. 8, the frame 130 is approached to the substrate 210 so as to compress the first elastic rubbers 150a. Hereby, the first elastic rubbers 150a press the first heat dissipation section 120a toward the memory 220, respectively. Hereby, the first heat dissipation section 120a and the memory 220 are thermally coupled with each other.

At this time, when the first elastic rubbers 150a is thermally conductive, the first elastic rubbers 150a thermally couples the heat dissipation section 120a and the frame. Hereby, the heat of the memory 220 conducts to the frame 130 through the first heat dissipation section 120a and the first elastic rubbers 150a. As a result, the heat of the heat-generating component can be dissipated, even when the heat of the heat-generating component (memory 220) exceeds, for example, the heat dissipation capability of the first heat dissipation section 120a which is thermally coupled with the heat-generating component.

Next, as shown in FIG. 8, the screw 161 of the screw with spring 160 is attached to the second flange section 122b of the second heat dissipation section 120b through the screw hole 132. At this time, the helical spring 162 is compressed by the screw 161 which is fastened to the second flange section 122b. Hereby, the helical spring 162 presses the second heat dissipation section 120b toward the CPU 230. Therefore, the second heat dissipation section 120b and the CPU 230 are thermally coupled with each other.

At this time, when the screw 161 and the helical spring 162 are thermally conductive, the screw 161 and the helical spring 162 thermally connect the second heat dissipation section 120b and the frame 130. Hereby, the heat of the CPU 230 conducts to the frame 130 through the first heat dissipation section 120b, the screw 161, and the helical spring 162. As a result, even when the heat of the heat-generating component (CPU 230) exceeds, for example, the heat dissipation capability of the second heat dissipation section 120b which is thermally connected with the heat-generating component, the heat of the heat-generating component can be dissipated.

As above, the cooling device 100A in the second exemplary embodiment of the present invention is configured by the screws with spring 160 (spring member) as the second connecting section. Accordingly, the same effect as described in the first exemplary embodiment can be achieved.

In the cooling device 100A in the second exemplary embodiment of the present invention, the first connecting section is the screw with spring 160 (spring member) when the first heat-generating component is the CPU 230, and the second connecting section is the elastic rubber 150 (rubber member) when the second heat-generating component is the memory (storage device).

In this way, when the second heat-generating component is the CPU 230, it is possible to press the second heat dissipation section 120b toward the CPU 230 with urging force larger than the force of the elastic rubbers 150 by using the helical spring 162 included in the screw with spring 160. Hereby, the second heat dissipation section 120b and the CPU 230 can be thermally coupled more securely.

On the other hand, in general, an area of contact for the first elastic rubber 150a to contact with the first heat dissipation section 120a and the frame 130 is smaller than an area of contact for the screw 161 and the helical spring 162 to contact with the second heat dissipation section 120b and the frame 130. Therefore, it is suppressed that the heat of the memory 220 conducted to the frame 130 conducts to the second heat dissipation section 120b through the frame 130, the screw 161, and the helical spring 162.

On the contrary, it is difficult to conduct the heat of the CPU 230, which is conducted to the second heat dissipation section 120b, to the frame 130 through the screw 161 and the helical spring 162. In this way, by the second connecting section to be configured by the screw with spring 160, a specified heat dissipation section (second heat dissipation section 120b) can be thermally isolated from the frame 130 connected to another heat dissipation section (first heat dissipation section 120a).

Note that the material of the screw 161 and the helical spring 162 can also be configured by a resin member, which has low thermal conductivity. In this case, it becomes more difficult to conduct the heat of the CPU 230, which is conducted to the second heat dissipation section 120b, to the frame 130 through the screw 161 and the helical spring 162. As a result, a specific heat dissipation section (second heat dissipation section 120b) can be thermally disconnected more securely from the frame 130, which is connected to another heat dissipation section (first heat dissipation sections 120a).

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

REFERENCE SIGNS LIST 100, 100A Cooling device
120a First heat dissipation section
120b Second heat dissipation section
121 Fin
122a First flange sections
122b Second flange sections
130 Frame
131a First opening
131b Second opening
140 Frame holding member
150a First elastic rubber
150b Second elastic rubber
160 Screw with spring
161 Screw
162 Helical spring
200 Electronic substrate
210 Substrate
220 Memory
230 CPU

What is claimed is:

1. A cooling device comprising:
first and second heat dissipation sections that are thermally coupled with first and second heat-generating components, respectively, the first and second heat-generating components mounted on a first surface of a substrate;
a frame arranged above the first surface of the substrate;
first and second openings formed in the frame, positions of the first and second openings corresponding to positions at which the first and second heat dissipation sections are provided, respectively;
first and second flexible connecting sections provided at peripheries of the first and second openings, respectively, the first and second connecting sections respectively connecting the first and second heat dissipation sections and the frame; and
first and second flange sections formed at the first and second heat dissipation sections so as to protrude from outer peripheral sections of the first and second heat dissipation sections and to face corresponding outer peripheral rims of the first and second openings, respectively,
wherein the first and second connecting sections are provided between surfaces of the first and second flange sections, which face the first and second openings, and the outer peripheral rims of the first and second openings, respectively, and
when the first and second openings are rectangular, the first flange section are formed so as to trace at least a pair of opposing sides of the first opening, and the second flange sections are formed so as to trace at least a pair of opposing sides of the second opening, and
the first and second flange sections are arranged so as not to face each other between the first and second openings.

2. The cooling device according to claim 1, wherein one of or both the first and second connecting sections are each a spring member or a rubber member.

3. The cooling device according to claim 1, wherein
the first connecting section is a spring member when the first heat-generating component is a central processing unit, and
the second connecting section is a rubber member when the second heat-generating component is a memory.

4. The cooling device according to claim 1, wherein
the first connecting section, the second connecting section, and the frame are thermally conductive.

5. A device comprising:
first and second heat-generating components mounted on a first surface of a substrate;
first and second heat dissipation sections that are thermally coupled with the first and second heat-generating components, respectively;
a frame arranged above the first surface of the substrate;
first and second openings formed in the frame, positions of the first and second openings corresponding to positions at which the first and second heat dissipation sections are provided, respectively;
first and second flexible connecting sections provided at peripheries of the first and second openings respectively connecting the first and second heat dissipation sections and the frame; and
first and second flange sections formed at the first and second heat dissipation sections so as to protrude from outer peripheral sections of the first and second heat dissipation sections and to face corresponding outer peripheral rims of the first and second openings, respectively,
wherein the first and second connecting sections are provided between surfaces of the first and second flange sections, which face the first and second openings, and the outer peripheral rims of the first and second openings, respectively, and
when the first and second openings are rectangular, the first flange section are formed so as to trace at least a pair of opposing sides of the first opening, and the second flange sections are formed so as to trace at least a pair of opposing sides of the second opening, and
the first and second flange sections are arranged so as not to face each other between the first and second openings.

* * * * *